US008809873B2

(12) United States Patent
Chung et al.

(10) Patent No.: US 8,809,873 B2
(45) Date of Patent: Aug. 19, 2014

(54) DISPLAY DEVICE

(75) Inventors: Jin-Koo Chung, Suwon-si (KR);
Jun-Ho Choi, Yongin-si (KR);
Sung-Soo Lee, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 984 days.

(21) Appl. No.: 12/414,167

(22) Filed: Mar. 30, 2009

(65) Prior Publication Data
US 2010/0102320 A1 Apr. 29, 2010

(30) Foreign Application Priority Data

Oct. 28, 2008 (KR) .................. 10-2008-0105793

(51) Int. Cl.
*H01L 27/12* (2006.01)
(52) U.S. Cl.
USPC ........................ 257/79; 257/59; 349/106
(58) Field of Classification Search
USPC ........................................................... 257/79
See application file for complete search history.

(56) References Cited

U.S. PATENT DOCUMENTS

| 4,470,667 | A | * | 9/1984 | Okubo et al. ................... 349/42 |
| 5,282,070 | A | * | 1/1994 | Nishida et al. ................. 349/111 |
| 5,345,324 | A | * | 9/1994 | Koseki et al. ................... 349/44 |
| 5,777,701 | A | * | 7/1998 | Zhang ............................. 349/44 |
| 5,777,707 | A | * | 7/1998 | Masaki et al. ................. 349/110 |
| 5,943,108 | A | * | 8/1999 | Hiyama et al. ................ 349/106 |
| 6,580,475 | B2 | * | 6/2003 | Yamazaki et al. .............. 349/43 |
| 7,218,294 | B2 | * | 5/2007 | Koyama et al. ................. 345/76 |
| 2001/0030322 | A1 | * | 10/2001 | Yamazaki et al. ............. 257/59 |
| 2004/0189885 | A1 | * | 9/2004 | Song ............................... 349/50 |
| 2005/0225863 | A1 | * | 10/2005 | Krasnov et al. .............. 359/601 |
| 2006/0158098 | A1 | * | 7/2006 | Raychaudhuri et al. ...... 313/503 |
| 2007/0108440 | A1 | * | 5/2007 | Kubota ........................... 257/40 |
| 2007/0195239 | A1 | * | 8/2007 | Lee et al. ...................... 349/114 |

FOREIGN PATENT DOCUMENTS

| JP | 2007-027042 | 2/2007 |
| KR | 10-2005-0113751 | 12/2005 |
| KR | 10-2005-0115049 | 12/2005 |
| KR | 10-2006-0038148 | 5/2006 |
| KR | 10-2006-0104707 | 9/2006 |
| KR | 10-2007-0019007 | 2/2007 |
| KR | 10-2007-0025529 | 3/2007 |
| KR | 10-0712184 | 4/2007 |
| KR | 10-2007-0049007 | 5/2007 |
| KR | 10-2007-0052625 | 5/2007 |
| KR | 10-2007-0056469 | 6/2007 |
| KR | 10-0770267 | 10/2007 |
| KR | 10-2008-0030175 | 4/2008 |
| KR | 10-2008-0058913 | 6/2008 |

* cited by examiner

*Primary Examiner* — Robert Carpenter
(74) *Attorney, Agent, or Firm* — H.C. Park & Associates, PLC

(57) ABSTRACT

A display device is provided. The display device includes a substrate, a light blocking member formed on the substrate as a plurality of light blocking portions separated from each other, a thin film transistor including a gate line, a data line, and a semiconductor layer formed on the light blocking member, a plurality of color filters formed on the gate line, the data line, and the thin film transistor, a pixel electrode formed on the color filters and connected to the thin film transistor, and a light blocking filter covering a portion of a separation region separating the light blocking portions.

20 Claims, 6 Drawing Sheets

DISPLAY DEVICE

CROSS REFERENCE TO RELATED APPLICATION

This application claims priority from and the benefit of Korean Patent Application No. 10-2008-0105793 filed in the Korean Intellectual Property Office on Oct. 28, 2008, which is hereby incorporated by reference for all purposes as if fully set forth herein.

BACKGROUND OF THE INVENTION

1. Field of the Invention

The present invention relates to a display device.

2. Discussion of the Background

Currently, as the demand for lighter and thinner monitors and TVs is increasing, cathode ray tubes (CRTs) are being replaced by liquid crystal displays (LCDs).

However, because the LCD is a passive display device, an additional back-light as a light source is needed, and the LCD has various problems such as a slow response time and a narrow viewing angle.

Among the flat panel displays, an organic light emitting device (organic light emitting diode display, OLED display) has recently been the most promising as a display device for solving these problems.

The organic light emitting device includes two electrodes and an organic light emitting layer interposed between the two electrodes. One of the two electrodes injects holes and the other injects electrons into the light emitting layer. The injected electrons and holes are combined to form excitons, and the excitons emit light as discharge energy.

Because the organic light emitting device is a self-emissive display device, an additional light source is not necessary such that the organic light emitting device has low power consumption, and it can be manufactured with a thin structure. Also, the organic light emitting device has a high response speed, a wide viewing angle, and a high contrast ratio, as well as a simplified manufacturing process compared with the liquid crystal display.

However, the organic light emitting device (OLED) may have an opaque and highly reflective electrode that is made of a highly reflective metal such as aluminum (Al) or silver (Ag) with a positive polarity or a negative polarity without regard to emitting direction. Accordingly, the metal functions as a mirror when the organic light emitting device is exposed to external light such that the contrast ratio is reduced.

SUMMARY OF THE INVENTION

The present invention provides an apparatus and a method that may increase the contrast ratio of a display device.

Additional features of the invention will be set forth in the description which follows and in part will be apparent from the description, or may be learned by practice of the invention.

The present invention discloses a display device including a substrate, a light blocking member disposed on the substrate and includes a plurality of light blocking portions separated from each other, a thin film transistor comprising a gate line a data line, and a semiconductor layer, and disposed on the substrate, a plurality of color filters disposed on the gate line, the data line, and the thin film transistor, a pixel electrode formed on the color filters and connected to the thin film transistor, and a light blocking filter covering a portion of a separation region separating the light blocking portions.

The separation region may include a first portion corresponding to the semiconductor layer, a second portion corresponding to the color filter, and a third portion corresponding to a space between the light blocking portions.

The light blocking filter may cover the first portion.

The light blocking filter may cover the third portion.

The color filter may cover the second portion.

The semiconductor layer may include polysilicon.

The color filter may include red, green, and blue, color filter, and the light blocking filter includes at least one of the red, green, and blue color filters.

The light blocking filter may include at least two different color filters among the red, green, and blue color filters that are overlapped with each other.

The light blocking filter may include the blue color filter.

The plurality of color filters may be separated from each other per each pixel.

The display device may further include an organic emission layer disposed on the pixel electrode and a common electrode disposed on the organic emission layer.

The organic emission layer may be made of a white emission layer.

the color filter may include red, green, and blue color filters, and the organic emission layer may include red, green, and blue emission layers respectively corresponding to the red color filter, the green color filter, and the blue color filter.

The common electrode may include a reflective metal.

The light blocking member may overlap a portion of the data line or the gate line.

The thin film transistor may include a first thin film transistor including a first gate electrode connected to the gate line, a first source electrode connected to the data line, and a first drain electrode, and a second thin film transistor including a second gate electrode connected to the first drain electrode, a second source electrode connected to a power voltage, and a second drain electrode connected to the pixel electrode.

The present invention also discloses a display device including a substrate, a light blocking member disposed on the substrate and including a plurality of light blocking portions separated from each other, a first insulating layer covering the light blocking member, a semiconductor layer disposed on the first insulating layer, a second insulating layer covering the semiconductor layer, a gate electrode disposed on the second insulating layer and disposed at a position corresponding to the semiconductor layer, a third insulating layer covering the gate electrode, a source electrode and a drain electrode disposed on the third insulating layer and connected to the semiconductor layer through contact holes of the third insulating layer and the second insulating layer, a color filter disposed on the third insulating layer, a light blocking filter disposed on the third insulating layer and covering a portion of a separation region separating the light blocking portions, a fourth insulating layer covering the color filter and the light blocking filter, and a pixel electrode disposed on the fourth insulating layer and connected to the drain electrode through a contact hole passing through at least the fourth insulating layer.

The separation region may include a first portion corresponding to the semiconductor layer, a second portion corresponding to the color filter, and a third portion corresponding to a space between the light blocking portions.

The display device may further include a partition disposed on the fourth insulating layer and defining an emitting region enclosing edges of the pixel electrode, an emission layer disposed on the pixel electrode, and a common electrode disposed on the emission layer.

The light blocking filter may cover the first portion and the third portion.

The color filter may include red, green, and blue color filters, and the light blocking filter may include at least one of the red, green, and blue color filters.

According to the present invention, the light blocking member is formed with the plurality of separated portions such that parasitic capacitance generated between the wiring lines may be reduced, and the additional color filter for blocking the light on the portion where the light blocking member is not formed is formed such that the contrast ratio may be improved.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
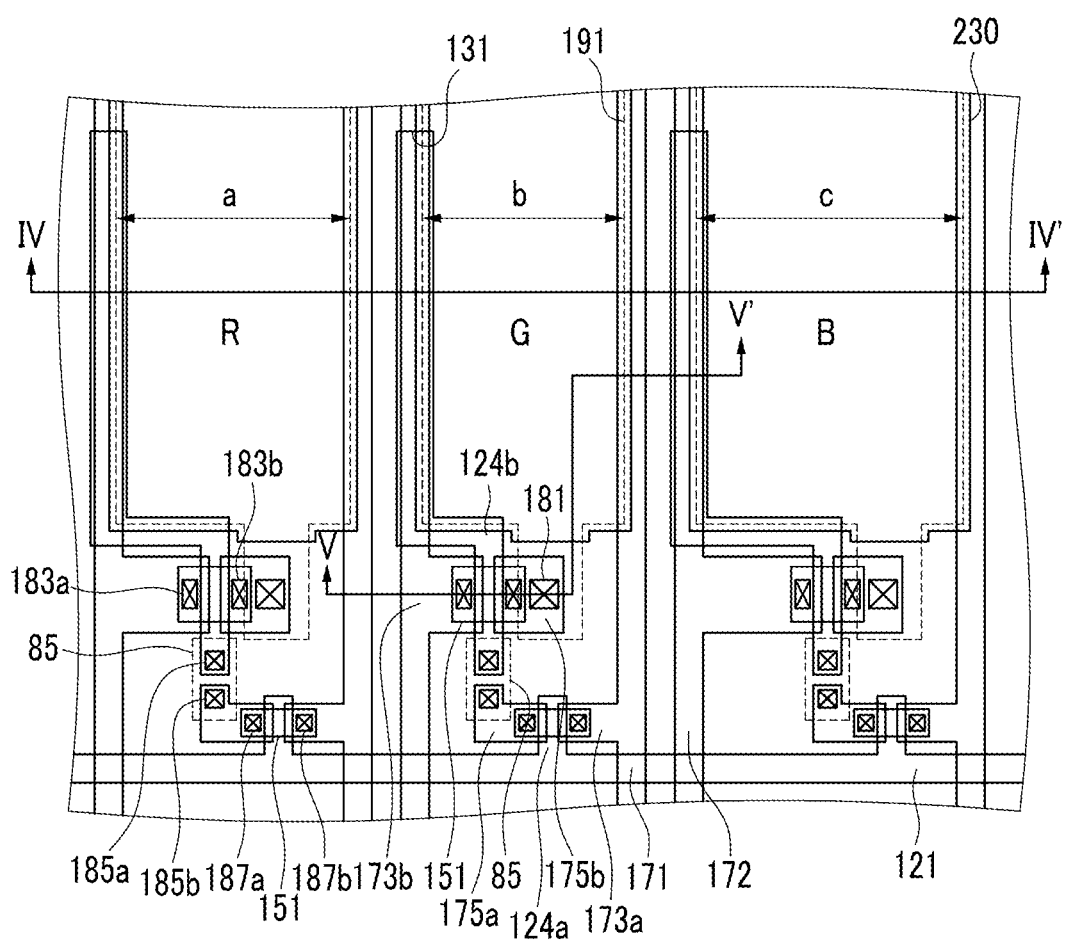
FIG. 1 is a plan view of a display device according to an exemplary embodiment of the present invention.

The invention is described more fully hereinafter with reference to the accompanying drawings in which embodiments of the invention are shown. This invention may, however, be embodied in many different forms and should not construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening members may be present. In contrast when an element is referred to as being "directly on" or "directly connected to" another element or layer, there are no intervening elements or layers present.

Figure 2:
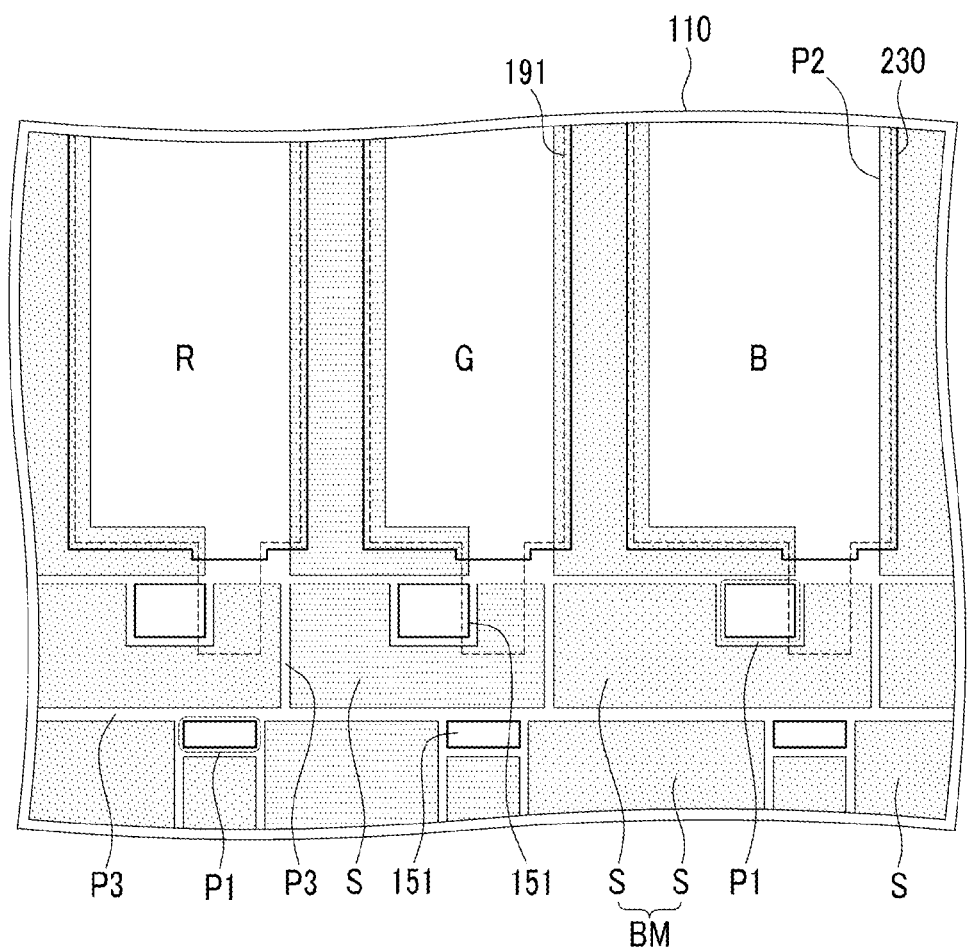
FIG. 2 is a plan view of a light blocking member in a display device according to an exemplary embodiment of the present invention.
Figure 3:
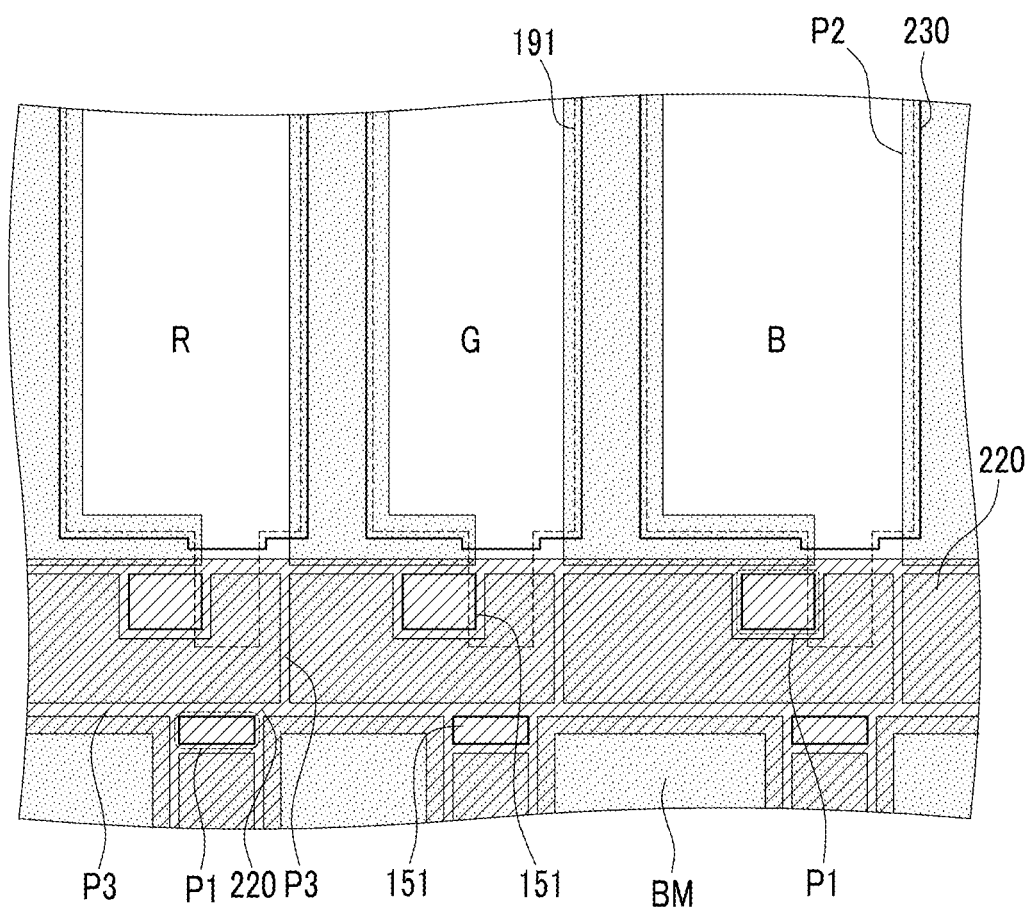
FIG. 3 is a plan view of a light blocking filter in a display device according to an exemplary embodiment of the present invention.

FIG. 1 is a plan view of a display device according to an exemplary embodiment of the present invention. FIG. 2 is a plan view of a light blocking member in a display device according to an exemplary embodiment of the present invention. FIG. 3 is a plan view of a light blocking filter in a display device according to an exemplary embodiment of the present invention.

A display device according to an exemplary embodiment of the present invention will now be described with reference to FIG. 1, FIG. 2, and FIG. 3.

In FIG. 1, a data line 171, a power supplying line 172, and a gate line 121 neighboring each other define a pixel area, and the defined pixel area includes a switching thin film transistor, a driving thin film transistor, an organic electroluminescence element (i.e. pixel electrode 191), and a storage capacitor.

In detail, a source electrode 173a of the switching thin film transistor is connected to the data line 171, a gate electrode 124a thereof is connected to the gate line 121, and the switching thin film transistor switches the data signal transmitted through the data line 171 in response to the gate signal transmitted through the gate line 121.

In the driving thin film transistor, a drain electrode 175b of the driving thin film transistor is connected to one electrode of the organic electroluminescence element through a contact hole 181, similarly a pixel electrode 191 and a source electrode 173b of the driving thin film transistor are connected to the power supplying line 172. A gate electrode 124b of the driving thin film transistor is connected to a drain electrode 175a of the switching thin film transistor through contact holes 185a and 185b and a connecting member 85 such that current flow between the source electrode 173b and the drain electrode 175b of the driving thin film transistor is controlled in response to a voltage change of the input data signal, thereby controlling the emitting amount of the organic electroluminescence element.

That is, one terminal of the organic electroluminescence element is connected to the drain electrode 175b of the driving thin film transistor such that light corresponding to an amount of voltage difference between the gate electrode 124b and the source electrode 173b of the driving thin film transistor is emitted.

A storage capacitor including a storage electrode line 131 patterned along with the gate electrode 124b and the power supplying line 172 stores a driving voltage.

In each pixel area, a color filter 230 including a red color filter R, a green color filter G, and a blue color filter B may be formed. The color filters R, G, and B may be overlapped with each other on the data line 171 and the power supplying line 172. For example, the color filters R, G, and B may be formed to be overlapped with a portion of the gate line 121, the data line 171, and the power supplying line 172. The color filters R, G, and B may be disposed in a different sequence.

Here, the red color filter R, the green color filter G, and the blue color filter B may have a difference of life time and efficiency such that the areas occupied thereby may be different from each other. In terms of the relationship between the widths a, b, and c of the red color filter R, the green color filter G, and the blue color filter B shown in FIG. 1, the width c of the blue color filter B may be the widest, followed by the red color filter R and the green color filter G.

In FIG. 2, a portion of the constituent elements according to an exemplary embodiment of the present invention is omitted to show the structure of a light blocking member BM to distinguish the display device according to an exemplary embodiment of the present invention. Referring to FIG. 1 and FIG. 2, the structure of the light blocking member of the display device according to an exemplary embodiment of the present invention will be described in detail.

A flat display element like an active organic light emitting device includes various wiring lines for applying power to the switching elements. These lines can reflect external light from their metallic surfaces leading to a deterioration in the contrast ratio of the device.

To solve this problem, the light blocking member is formed on all regions except for the openings corresponding to the pixel areas to improve the contrast ratio. However, in the instance where an active matrix (AM) OLED is in bottom emission mode, if the light blocking member is formed on all portions except for the opening corresponding to the pixel areas, the following problems may be generated: When the light blocking member is formed with one pattern on the entire panel, a larger capacitance may be formed between a light blocking member made of a metal such as chromium and the metallic wiring of the device such that the signal transmitted through the wiring is delayed, thereby generating driving problems.

Accordingly, the light blocking member BM of the display device according to an exemplary embodiment of the present invention is divided into several pieces on a substrate 110, as shown in FIG. 2. As depicted therein the light blocking member BM is made of a plurality of light blocking portions S that are separated from each other. The light blocking portions S are separated via separation regions P1, P2, and P3 extending in a direction parallel to the gate lines 121 or data lines 171.

The light blocking member BM has a first region P1 exposing the substrate 110 at a position overlapping the semiconductor layer 151 included in the switching and driving thin film transistors. Also, the light blocking member BM has a second region P2 exposing the substrate 110 at a position overlapping the pixel electrode 191. In addition, the light blocking member BM has a third region P3 between the light blocking portions S except for the first region P1 and the second region P2. In other words, the separation regions include the first region P1, the second region P2, and the third region P3.

Good performance of the thin film transistor is necessary in an AMOLED due to its driving characteristic wherein the amount of current controls the brightness of the display in contrast to the performance characteristics of a liquid crystal display. Accordingly, it is preferable that the semiconductor layer 151 is made of polysilicon. To form the semiconductor layer 151 with polysilicon, when the semiconductor layer 151 is crystallized by a laser, if the light blocking member BM is disposed under the semiconductor layer 151, uniform crystallization may be hindered. Accordingly, the light blocking member BM is not formed on the first region P1 overlapping the semiconductor layer 151 in the exemplary embodiment of the present invention.

Accordingly, in FIG. 2, the light blocking member 151 exposes the substrate 110 in the first region P1 overlapping the semiconductor layer 151, the second region P2 overlapping the pixel electrode 191, and the third region P3 between a plurality of light blocking portions S.

Here, the color filters R, G, and B are formed on the region overlapping the pixel electrode 191. However, the first region P1 overlapping the semiconductor layer 151 and the third region P3 as the separation region between the light blocking portions S are opened to external light. Accordingly, a metal such as a cathode having reflective qualities such that it functions as a mirror, directly shows through the separation region such that it reflects external light. Such reflection can result in a decrease in the contrast ratio of the device.

To solve this problem, a light blocking filter 220 covering the separation region separating the light blocking portions S from each other on the non-emitting region is formed in the display device according to an exemplary embodiment of the present invention, and will be described with reference to FIG. 3.

Referring to FIG. 3, to prevent the reflection of external light in an exemplary embodiment of the present invention, the light blocking filter 220 is formed to cover the separation region between the light blocking portions S and the portion where the light blocking member BM is not formed and the semiconductor layer 151 is disposed.

The light blocking filter 220 may completely cover the separation region between the light blocking portions S and the portion on the semiconductor layer 151, and may partially overlap the pixel electrode 191. The light blocking filter 220 may include one of the color filters R, G, and B. Here, the light blocking filter 220 may be formed by overlapping at least two different color filters among the color filters R, G, and B.

When the light blocking filter 220 is formed in one layer, it may be preferable that the light blocking filter 220 is formed of the blue color filter B, only passing blue light and having the smallest influence on luminance. The light blocking filter 220 may also be formed from separate color filters R, G, and B covering the entire surface of the non-emitting region.

Next, a display device according to an exemplary embodiment of the present invention will be described in detail with reference to FIG. 4 and FIG. 5.

Figure 4:
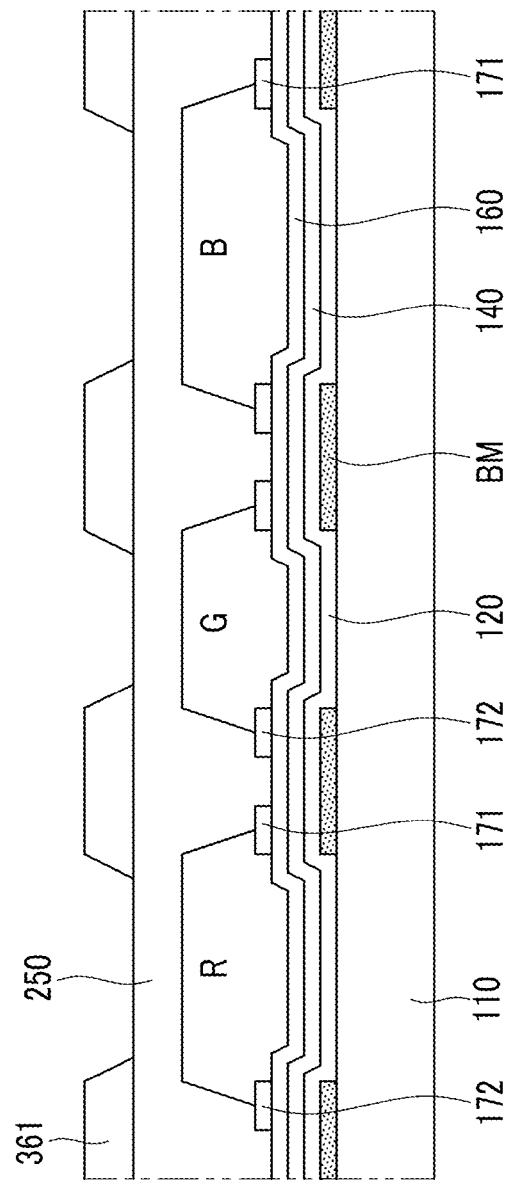
FIG. 4 is a cross-sectional view taken along the line IV-IV' of FIG. 1.
Figure 5:
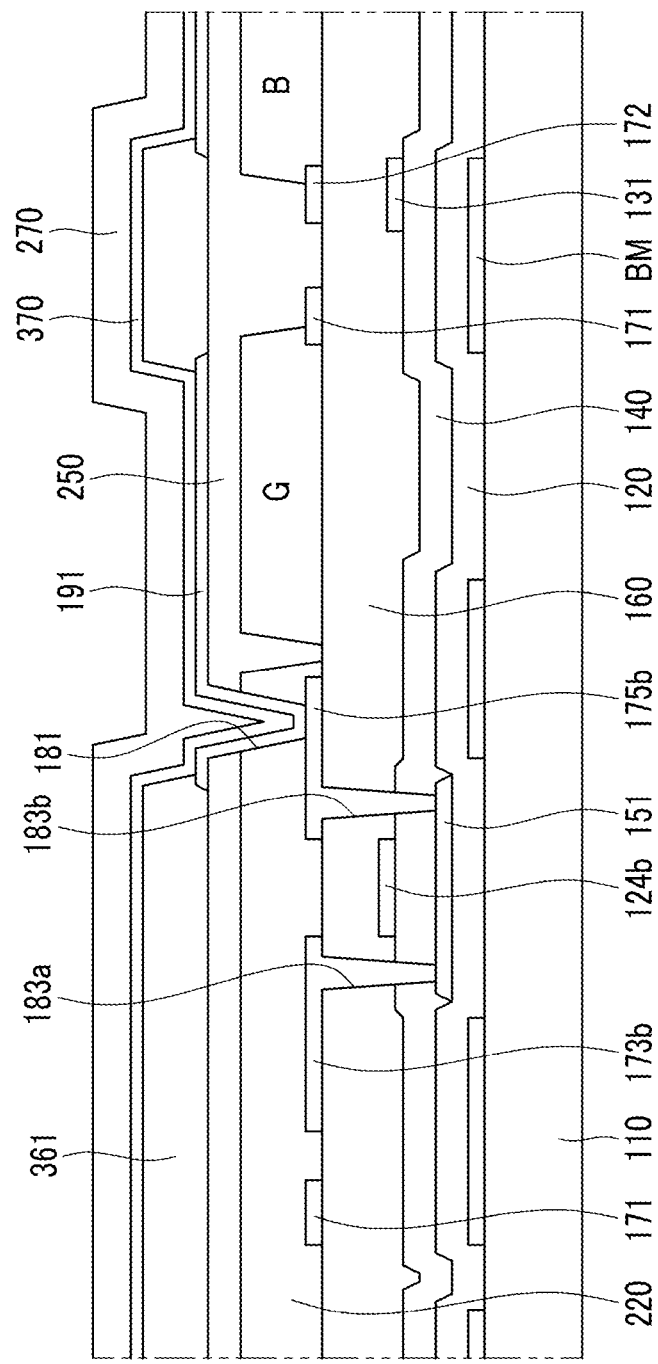
FIG. 5 is a cross-sectional view taken along the line V-V' of FIG. 1.

FIG. 4 is a cross-sectional view taken along the line IV-IV' of FIG. 1. FIG. 5 is a cross-sectional view taken along the line V-V' of FIG. 1.

Referring to FIG. 1, FIG. 2, FIG. 3, FIG. 4 and FIG. 5, a light blocking member BM having a plurality of light blocking portions S separated from each other is formed on a substrate 110. The light blocking member BM may be made of an opaque material having low reflectance to prevent the reflection of external light. The light blocking member BM may be formed of a metallic material having low reflectance such as chromium and molybdenum (Mo), or an opaque material such as chromium oxide and molybdenum oxide. Also, the light blocking member BM may be made of a mixture layer including a metallic material of chromium and an opaque material of chromium oxide.

A lower interlayer insulating layer 120 covering the light blocking member BM is formed on the substrate 110. A semiconductor layer 151 including a source region, a drain region, and a channel region is formed on the lower interlayer insulating layer 120. The semiconductor layer 151 may be made of hydrogenated amorphous silicon or polysilicon and it may be formed as an island.

A gate insulating layer 140 covering the semiconductor layer 151 is formed on the lower interlayer insulating layer 120. A gate line 121 extending in a transverse direction is formed on the gate insulating layer 140. One end of the gate line 121 is used to receive the signal transmitted from a gate driver (not shown), and the end may be wider than the gate line 121 itself.

Also, a storage electrode line 131 for increasing storage capacitance of the pixel may be formed with the same layer as the gate line 121. The storage electrode line 131 forms a storage capacitor by overlapping the power supplying line 172.

The gate line 121 may be made by a photolithography process. Also, a portion of the gate line 121 or the storage electrode line 131, or a branch thereof, may be used as a gate electrode 124a or 124b of a thin film transistor. The gate electrodes 124a and 124b correspond to the semiconductor layer 151. An upper interlayer insulating layer 160 covering the gate line 121 and the storage electrode line 131 is formed on the gate insulating layer 140.

In a display device according to an exemplary embodiment of the present invention, the semiconductor layer 151 may be made of amorphous silicon rather than polysilicon, and a bottom gate structure in which a gate electrode is disposed under the semiconductor layer may be formed. Also, in the above-described driving element and switching element, at least one of a plurality of semiconductor layers included in the driving thin film transistor and the switching thin film transistor may be made of polysilicon and the remainder made of amorphous silicon.

A metal layer is deposited on the upper interlayer insulating layer 160 by sputtering, and is patterned by a photolithography process using a mask to form a data line 171 having source electrodes 173a and 173b, drain electrodes 175a and 175b, and a power supplying line 172 having source electrodes 173b.

The gate line 121 and the data line 171 may overlap a portion of the light blocking member BM.

The source electrodes 173a and 173b and the drain electrodes 175a and 175b are respectively connected to the source regions and the drain regions of the semiconductor layer 151 through contact holes 183a, 183b, 187a, and 187b. Here, the data line 171 and the power supplying line 172 transmit the data signal and the power voltage respectively and define the pixel area by crossing with the gate line 121.

One end of the data line 171 may have a wider width than that of the data line 171 itself to receive the signal transmitted from a data driver (not shown). Also, the data line 171 and the power supplying line 172 are generally formed in the same layer. However, the power supplying line 172 may be formed with a different layer from the data line 171.

A red color filter R, a green color filter G, and a blue color filter B, which extend along the column of the pixel defined by the data line 171 and the power supplying line 172, and parallel to the direction of the data line 171 and the power supplying line 172, are formed on the upper interlayer insulating layer 160. The red color filter R, the green color filter G, and the blue color filter B may be alternately disposed in the pixel column. The color filter 230 including the red color filter R, the green color filter G, and the blue color filter B may overlap a portion of the data line 171 and the power supplying line 172.

An overcoat 250 is formed on the color filters R, G, and B. The overcoat 250 functions to provide a flat surface by covering the color filters R, G, and B.

A pixel electrode 191 is formed on the red color filter R, the green color filter G, and the blue color filter B. The red color filter R, the green color filter G, and the blue color filter B are disposed on the emitting regions corresponding to pixel electrode 191, and the light blocking filter 220 including at least one of the red color filter R, the green color filter G, and the blue color filter B is formed on the upper interlayer insulating layer 160. The light blocking filter 220 may be made of the same material as the color filters R, G, and B. Also, the light blocking filter 220 may be made from at least two different color filters chosen from among the red color filter R, the green color filter G, and the blue color filter B and overlapped. Here, the light blocking filter 220 may be formed while forming the color filters R, G, and B. Also, the light blocking filter 220 may be disposed on the same layer as the color filters R, G, and B.

The light blocking filter 220 is formed on the non-emitting region, and covers the separation region between the light blocking portions S forming the light blocking member BM. Also, the light blocking filter 220 covers the semiconductor layer 151. Accordingly, the light blocking filter 220 is disposed on the portion where the light blocking member BM is not formed in the non-emitting region such that the light blocking filter 220 replaces the function of the light blocking member BM, thereby eliminating the reflection of the external light.

The light blocking filter 220 may be made of a blue color filter material passing light of the blue wavelength by being formed along with the blue color filter B. The blue color filter has the smallest influence on luminance and reduces the effect of reflection from external light.

The pixel electrode 191 on the red color filter R, the green color filter G, the blue color filter B may be made of a transparent and conductive material such as indium tin oxide (ITO) or indium zinc oxide (IZO). Also, the pixel electrode 191 may be formed by depositing the transparent and conductive ITO or IZO material and patterning it through a photolithography process. The pixel electrode 191 is connected to the drain electrode 175b of the driving thin film transistor through the contact hole 181 of the color filters R, G, and B and the overcoat 250. In operation, the pixel electrode 191 receives a driving signal from the driving thin film transistor and provides it to the anode or the cathode of the organic electroluminescence element.

A partition 361 having an opening exposing the surface portion of the pixel electrode 191 is formed on the substrate 110 including the pixel electrode 191. The partition 361 may be made of an acryl-based organic layer. The partition 361 defines the emitting region by enclosing the edges of the pixel electrode 191.

Again referring to FIG. 1, a connecting member 85 may be simultaneously formed when patterning the transparent conductive layer to form the pixel electrode 191. The connecting member 85 connects the gate electrode 124b of the driving thin film transistor and the drain electrode 175a of the switching thin film transistor to transmit the signal.

An organic emission layer 370 is formed on the pixel electrode 191. The organic emission layer 370 includes a hole injection layer, a hole transport layer, an emission layer, and an electron transport layer to enhance efficiency. The organic emission layer 370 may be made of a white emission layer, thereby realizing full colors as a color filter type. Also, the organic emission layer 370 may be formed of red, green, and blue emission layers respectively corresponding to the red color filter R, the green color filter G, and the blue color filter B, thereby yielding a display device with excellent color reproducibility.

A common electrode 270 provided as the anode or the cathode of the organic light emitting element is formed on the entire surface of the organic emission layer 370. The common electrode 270 also performs the function of protecting the emission layer 370 from external moisture. The common electrode 270 may be made as a reflecting electrode.

Figure 6:
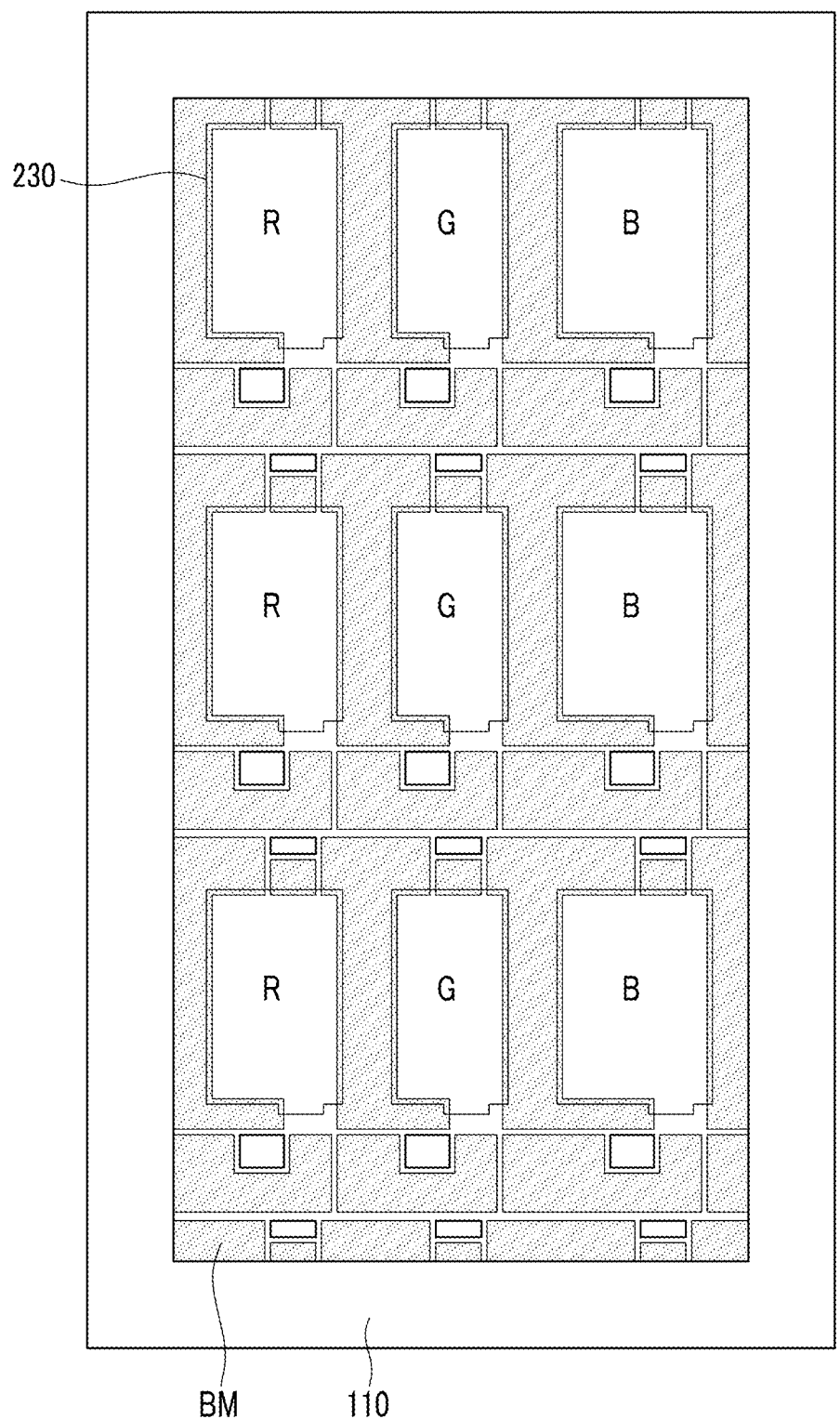
FIG. 6 is a plan view of a color filter in a display device according to another exemplary embodiment of the present invention.

FIG. 6 is a top plan view of the color filter in the display device according to an exemplary embodiment of the present invention.

Referring to FIG. 6, a red color filter R, a green color filter G, and a blue color filter B that are separated from each other per each pixel are formed. Here, different from that mentioned above, the red color filter R, the green color filter G, and the blue color filter B may be formed with the same color filter according to the column direction. Also, although not shown in the drawings, the red color filter R, the green color filter G, and the blue color filter B may respectively have a stripe shape in the display device according to an exemplary embodiment of the present invention.

It will be apparent to those skilled in the art that various modification and variations can be made in the present invention without departing from the spirit or scope of the invention. Thus it is intended that the present invention cover the modifications and variations of this invention, provided they come within the scope of the appended claims and their equivalents.

What is claimed is:
1. A display device, comprising:
a substrate;

a light blocking member disposed on the substrate and comprising a plurality of light blocking portions separated from each other in a top view;
an insulation layer disposed on the light blocking member;
a gate line and a data line disposed on the insulation layer;
a thin film transistor comprising a semiconductor layer and disposed on the substrate;
a plurality of color filters disposed on the substrate;
a pixel electrode connected to the thin film transistor; and
a light blocking filter covering a portion of a separation region separating the light blocking portions,
wherein the separation region comprises a first portion corresponding to the semiconductor layer, a second portion corresponding to the color filter, and a third portion corresponding to a space between the light blocking portions.

2. The display device of claim 1, wherein
the light blocking filter covers the first portion.

3. The display device of claim 1, wherein
the light blocking filter covers the third portion.

4. The display device of claim 1, wherein
the color filter covers the second portion.

5. The display device of claim 1, wherein
the semiconductor layer comprises polysilicon.

6. The display device of claim 1, wherein
the color filter comprises red, green, and blue color filters, and the light blocking filter comprises at least one of the red, green, and blue color filters.

7. The display device of claim 6, wherein
the light blocking filter comprises at least two different color filters among the red, green, and blue color filters that are overlapped with each other.

8. The display device of claim 6, wherein
the light blocking filter comprises the blue color filter.

9. The display device of claim 6, wherein
the plurality of color filters are separated from each other per each pixel.

10. The display device of claim 1, further comprising
an organic emission layer disposed on the pixel electrode and a common electrode disposed on the organic emission layer.

11. The display device of claim 10, wherein
the organic emission layer comprises a white emission layer.

12. The display device of claim 10, wherein
the common electrode comprises a reflective metal.

13. The display device of claim 1, wherein
the light blocking member overlaps a portion of the data line or the gate line.

14. The display device of claim 1, wherein the thin film transistor comprises:
a first thin film transistor comprising a first gate electrode connected to the gate line, a first source electrode connected to the data line, and a first drain electrode; and
a second thin film transistor comprising a second gate electrode connected to the first drain electrode, a second source electrode connected to a power voltage, and a second drain electrode connected to the pixel electrode.

15. The display device of claim 1, wherein the plurality of light blocking portions is disposed in the same layer.

16. A display device, comprising:
a substrate;
a light blocking member disposed on the substrate, and comprising a plurality of light blocking portions separated from each other;
a first insulating layer covering the light blocking member;
a semiconductor layer disposed on the first insulating layer;
a second insulating layer covering the semiconductor layer;
a gate electrode disposed on the second insulating layer and disposed at a position corresponding to the semiconductor layer;
a third insulating layer covering the gate electrode;
a source electrode and a drain electrode disposed on the third insulating layer and connected to the semiconductor layer through contact holes of the third insulating layer and the second insulating layer;
a color filter disposed on the third insulating layer;
a light blocking filter disposed on the third insulating layer, and covering a portion of a separation region separating the light blocking portions;
a fourth insulating layer covering the color filter and the light blocking filter; and
a pixel electrode disposed on the fourth insulating layer, and connected to the drain electrode through a contact hole passing through at least the fourth insulating layer.

17. The display device of claim 16, wherein
the separation region comprises a first portion corresponding to the semiconductor layer, a second portion corresponding to the color filter and a third portion corresponding to a space between the light blocking portions.

18. The display device of claim 17, wherein
the light blocking filter covers the first portion and the third portion.

19. The display device of claim 16, further comprising:
a partition disposed on the fourth insulating layer and defining an emitting region enclosing edges of the pixel electrode;
an emission layer disposed on the pixel electrode; and
a common electrode disposed on the emission layer.

20. The display device of claim 16, wherein
the color filter comprises red, green, and blue color filters, and the light blocking filter comprises at least one of the red, green, and blue color filters.

* * * * *